United States Patent [19]

Kawamura

[11] Patent Number: 4,694,256
[45] Date of Patent: Sep. 15, 1987

[54] COMPENSATION CIRCUIT FOR PULSE SIGNALS

[75] Inventor: Keiichi Kawamura, Kanagawa, Japan

[73] Assignee: Fuji Photo Film Co., Ltd., Kanagawa, Japan

[21] Appl. No.: 699,176

[22] Filed: Feb. 7, 1985

[30] Foreign Application Priority Data

Feb. 8, 1984 [JP] Japan .................................. 59-19886

[51] Int. Cl.[4] ........................ H03K 5/153; H03K 5/19; H03K 3/013
[52] U.S. Cl. ..................................... 328/120; 307/269; 307/271; 307/273; 307/470; 307/517; 307/520; 307/608; 328/164; 328/129.1; 358/155
[58] Field of Search ............ 328/109, 110, 120, 129.1, 328/167, 164; 307/273, 608, 219, 470, 517, 518, 520, 269, 271; 377/44; 358/155; 375/104

[56] References Cited

U.S. PATENT DOCUMENTS

| | | | |
|---|---|---|---|
| 2,984,789 | 5/1961 | O'Brien .................................. | 328/120 |
| 3,171,041 | 2/1965 | Haase .................................... | 375/104 |
| 3,383,605 | 5/1968 | Davidoff .............................. | 307/271 |
| 3,735,271 | 5/1973 | Leibowitz ............................. | 328/110 |
| 3,790,892 | 2/1974 | Tan et al. ............................. | 328/120 |
| 3,970,944 | 7/1976 | Huellwegen ......................... | 328/164 |
| 4,142,159 | 2/1979 | Ingram et al. ........................ | 307/273 |
| 4,374,361 | 2/1983 | Holden ................................. | 328/120 |
| 4,427,948 | 1/1984 | Rinaldi ................................. | 328/120 |

Primary Examiner—John S. Heyman

[57] ABSTRACT

A compensation circuit for pulse signals includes a noise pulse cutting circuit and a compensation pulse generating circuit. The noise pulse cutting circuit passes a reference pulse which is produced in each predetermined reference time period but blocks any other pulses until just before the next pulse is input after the reference pulse has passed. The compensation pulse generating circuit functions such that, when no pulse is input for a period of time slightly longer than the reference time period, a compensation pulse is generated and is input to the noise pulse cutting circuit. Even when there occurs noise in pulse signals, the circuit enables production of the same number of pulses as that of the reference pulses which are originally included in the pulse signals.

8 Claims, 10 Drawing Figures

COMPENSATION CIRCUIT FOR PULSE SIGNALS

BACKGROUND OF THE INVENTION

When, for example, a video signal recorded in a magnetic recording medium is reproduced on a television receiver, the images reproduced may be accompanied with superimposed images such as words and dates. For the superimposed images to be produced, the video signal for superimposed images is arranged to synchronously overlap the video signal for normal picture images. That is to say that in each frame the video signal for superimposed images is overlapped on the same horizontal scanning line.

Thus, in order to overlap a video signal for superimposed images on the same horizontal scanning line, horizontal drive pulses (HD pulses) separated from a composite synchronizing signal of the reproduced video signal are sequentially counted starting from the first horizontal scanning and at the time when a predetermined number (n) of pulses has been counted the video signal for superimposed images is overlapped on the reproduction video signal. Thus, the superimposed images enter from the n'th horizontal scanning line.

When the images magnetically recorded are reproduced, the reproduced signal is unavoidably accompanied by noise signals. Thus, in the horizontal drive pulse signal which produces the HD pulses, there may occur noise such as drop-ins caused by overlapping noise pulses and drop-outs caused by dropping out of a horizontal drive pulse. Therefore, when there is a drop-out of a horizontal drive pulse in the horizontal drive pulse signal or noise pulses are overlapping on the same, the superimposed image is inserted at a horizontal scanning line which is different from the horizontal scanning line at which the superimposed image should be entered. Moreover, since this noise occurs randomly the video signal for the superimposed image overlaps a different horizontal scanning line in each of the different frames or fields forming the reproduced picture. Therefore, the superimposed images reproduced will inevitably move vertically on the screen rapidly.

FIELD OF THE INVENTION

The present invention relates to a compensation circuit for pulse signals in which the pulse signal producing one reference pulse in each of a predetermined reference period is compensated so that even when there occurs noise in the pulse signals, for example, the mixing in of noise pulses or the dropping out of reference pulses, the circuit makes it possible to produce the same number of pulses as that of reference pulses which are originally included in the pulse signals.

SUMMARY OF THE INVENTION

The object of the present invention is to provide a compensation circuit for pulse signals which overcomes drawbacks in a conventional system and in which, even when noise occurs in pulse signals, such noise is removed and there are generated the same number of pulses as the reference pulses (for example HD pulses) which are originally included in the pulse signal.

Thus, the present invention provides a compensation circuit for pulse signals comprising: a noise pulse cutting circuit to which is input a pulse signal which generates one reference pulse at each predetermined reference time period and which assumes a pulse cutting mode for blocking the passing of pulses immediately after the passing of one pulse and reverts to a pulse pass mode for permitting the passage of pulses upon the lapse of a time slightly shorter than the said reference time period after the assumption of the pulse cutting mode, and a compensation pulse generating circuit to which is input an output signal of said noise pulse cutting circuit and which, if no pulse is input during a time period slightly longer than said reference time period, generates a compensation pulse which is input to said noise pulse cutting circuit, whereby the output of said noise pulse cutting circuit is made an external output signal.

DESCRIPTION OF THE PREFERRED EMBODIMENTS

In order to achieve the above mentioned object of the present invention, the compensation circuit for pulse signals of the present invention comprises a noise pulse cutting circuit which passes only the reference pulse which is produced in each predetermined reference time period. However, it blocks any other pulses until just before the next reference pulse is input after the reference pulse has passed. There is also compensation pulse generating circuit to which an output signal of the noise pulse cutting circuit is input and which functions such that, when the pulse is not input for a period of time slightly longer than the above mentioned reference time period, a compensation pulse is generated and is fedback to be input to the noise pulse cutting circuit.

According to the present invention, (a) By means of a noise pulse cutting circuit which allows the passing of pulses only when a reference pulse is produced, any noise pulses are removed.

(b) When the pulse is not input for longer than the reference time period, the compensation pulse generating circuit which generates a compensation pulse functions and, thus, even when the reference pulse drops out the compensation pulse is output in place of the reference pulse.

(c) Since the compensation pulse is fedback to the noise pulse cutting circuit, even when a noise pulse occurs immediately after the drop-out of the reference pulse, the noise pulse is removed and the compensation pulse which takes the place of the dropped-out reference pulse is output.

(d) As will be understood from the foregoing, such noises as drop-ins which are caused by the generation of noise pulses and drop-outs which are caused by the dropping-out of the reference pulse, are completely removed. Of course, even when drop-ins and drop-outs occur independently and continuously, or on the other hand the drop-ins and drop-outs occur alternately or irregularly, such noise can be removed. Therefore, by counting the number of pulses of the output signals from the compensation pulse circuit of the present invention, it is possible to effect the superimposition of the images without any vertical movement of the superimposed images. It is to be noted that the present invention is useful not only for accurately counting pulses in putting superimposed images in a reproduced video signal but also for other applications in which the accurate counting of reference pulse signals is necessary.

EMBODIMENT 1

Figure 1:
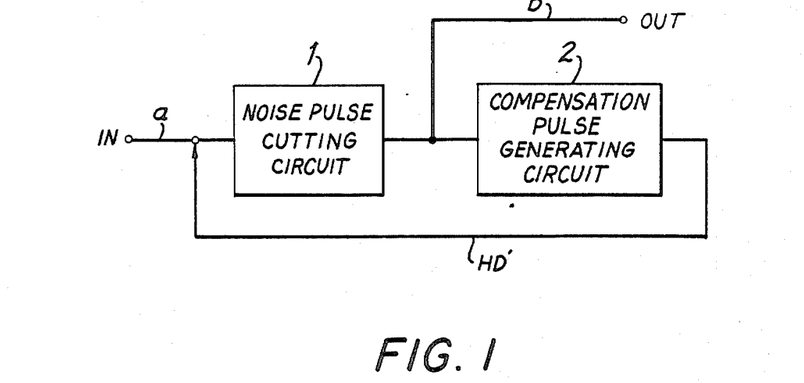
FIG. 1 is a block diagram showing a first embodiment of the present invention.
Figure 2:
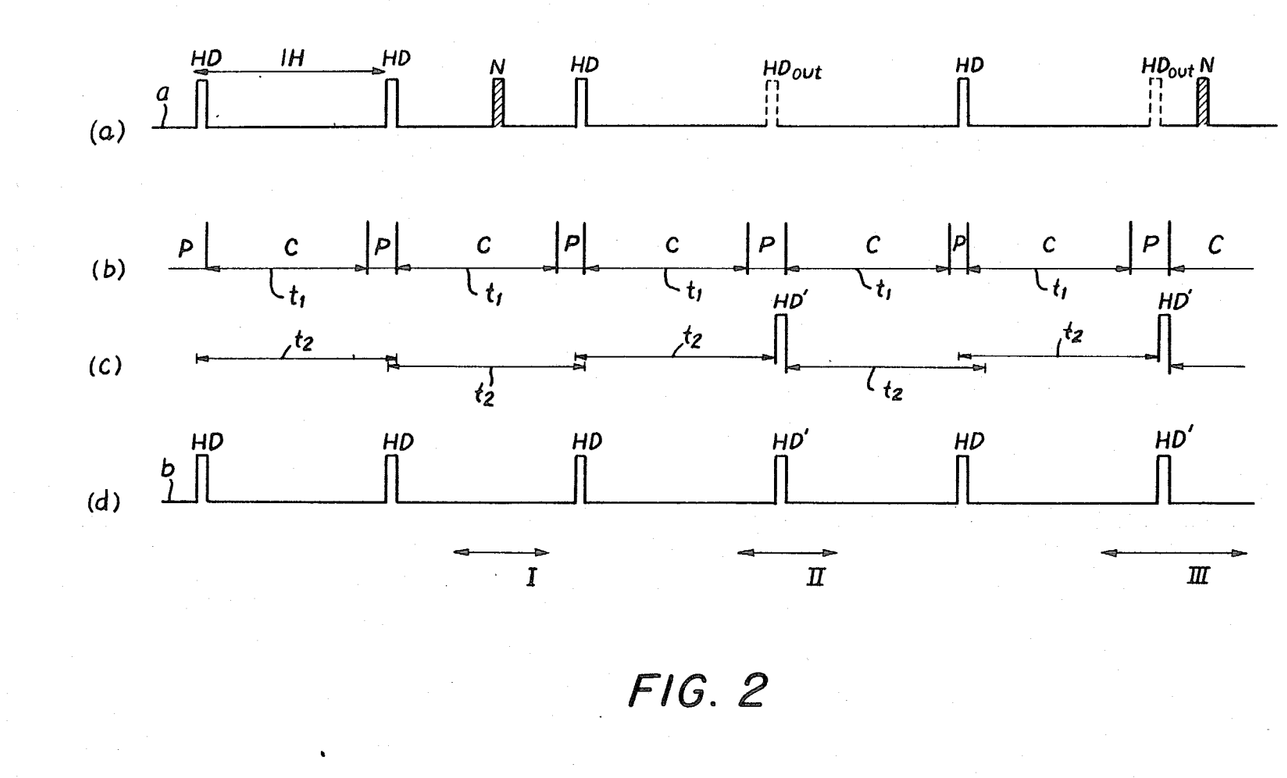
FIG. 2 is a functional explanatory diagram for the first embodiment.

The first embodiment of the present invention is now explained with reference to FIG. 1 which is a block diagram and FIG. 2 which is a functional explanatory diagram for this embodiment. As shown in these two drawings, the circuit according to this embodiment comprises a noise pulse cutting circuit 1 and a compensation pulse generating circuit 2. A horizontal drive pulse signal "a" which generates a horizontal drive pulse (HD pulse) at each horizontal scanning period (1 H) is input to an input terminal IN. As shown in FIG. 2 (b), the noise pulse cutting circuit 1 assumes a pulse cutting mode C to block the passing of any pulses immediately after the passing of one pulse such as an HD pulse, while this mode automatically reverts to a pulse pass mode P to permit the passing of pulses after the lapse of time t1 running from the time when the pulse cutting mode C is assumed and the time t1 is set to be slightly shorter than 1 H. On the other hand, as shown in FIG. 2 (c), the compensation pulse generating circuit 2 to which the output of the noise pulse cutting circuit 1 is input generates a compensation horizontal drive pulse HD' unless a pulse is input during a period of time slightly longer than 1 H. This compensation pulse HD' is input and fedback to the noise pulse cutting circuit 1. The above mentioned noise pulse cutting circuit 1 and the compensation pulse generating circuit 2 comprises, as explained later, a monostable multivibrator(s) and a counter.

According to this embodiment of the invention the removal of the various noise elements is effected in the following manner:

(1) When a noise pulse N occurs between the two HD pulses as in the time period I shown in FIG. 2: In this case, since the HD pulse generated before the noise pulse N has passed the noise pulse cutting circuit 1 and this noise pulse cutting circuit 1 is assuming a pulse cutting mode C, the noise pulse N cannot pass the noise pulse cutting circuit 1. Therefore, the noise pulse N is removed and is not included in the external output signal "b" shown in graph (d) of FIG. 2.

(2) When the drop-out (HDout) of a horizontal drive pulse occurs in the time period II shown in FIG. 2: In this case, a compensation horizontal drive pulse HD' is output from the compensation pulse generating circuit 2 upon the lapsing of time t2 after the generation of the preceding HD pulse. When the compensation horizontal drive pulse HD' is output, the time t1 has elapsed so that the noise pulse cutting circuit 1 has been reverted to a pulse pass mode P. Therefore, the compensation horizontal drive pulse HD' which has been fedback is output from the output terminal OUT after passing through the noise pulse cutting circuit 1. In other words, the external output signal "b", shown in graph (2), includes the compensation horizontal drive pulse HD' in place of the HD pulse which has dropped-out. Further, the noise pulse cutting circuit 1 assumes a pulse cutting mode C immediately after the passage of the compensation horizontal drive pulse HD' and this pulse cutting mode C continues for time t1.

(3) When the drop-out (HDout) of an HD pulse occurs and a noise pulse N occurs immediately thereafter as in the time period III shown in FIG. 2: In this instance, when the HDout occurs, the compensation horizontal drive pulse HD' is generated in the same way as in the above (2) and this is included in the external output signal "b". Immediately after the passage of the compensation horizontal drive pulse HD' through the noise pulse cutting circuit 1, this noise pulse cutting circuit 1 assumes a pulse cutting mode C. Thus, the noise pulse N generated after HDout is removed at the noise pulse cutting circuit 1. Consequently, even if the noise pulse N does occur following HDout, the external output signal "b" includes only the compensation horizontal drive pusle HD'. Thus, the remarkable feature of the present invention resides in the fact that the noise which is caused by the noise pulse N generated following HDout is removed and the compensation horizontal drive pulse HD' which corresponds to the HD pulse alone is output. This is further explained by way of comparison with the example shown in FIG. 3.

Figure 3:
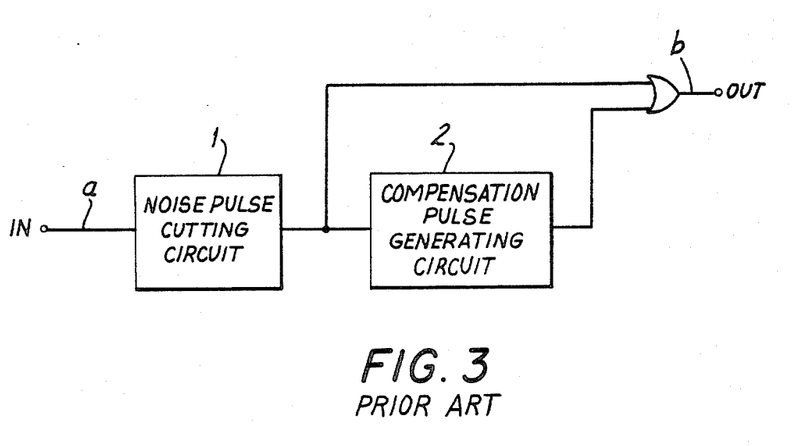
FIG. 3 is a block diagram showing an example of a simple connection between a noise pulse cutting circuit and a compensation pulse generating circuit without a feedback arrangement.

In FIG. 3, the numeral 1 is a noise pulse cutting circuit and the numeral 2 is a compensation pulse generating circuit. These circuits function in the same way as those shown in FIG. 1. In this embodiment, there is no feedback of the output of the compensation pulse generating circuit 2 to the noise pulse cutting circuit 1, but the noise pulse cutting circuit 1 and the compensation pulse generating circuit 2 are simply connected with each other, and the logical OR operation of both circuits is made an external output signal "b". Therefore, when a noise pulse N or a drop-out (HDout) of the HD pulse occurs independently it is possible to remove the noise but when a noise pulse N occurs following HDout it is not possible to remove the noise. The reason for this is explained with reference to FIG. 4 which illustrates the function of the embodiment shown in FIG. 3.

Figure 4:
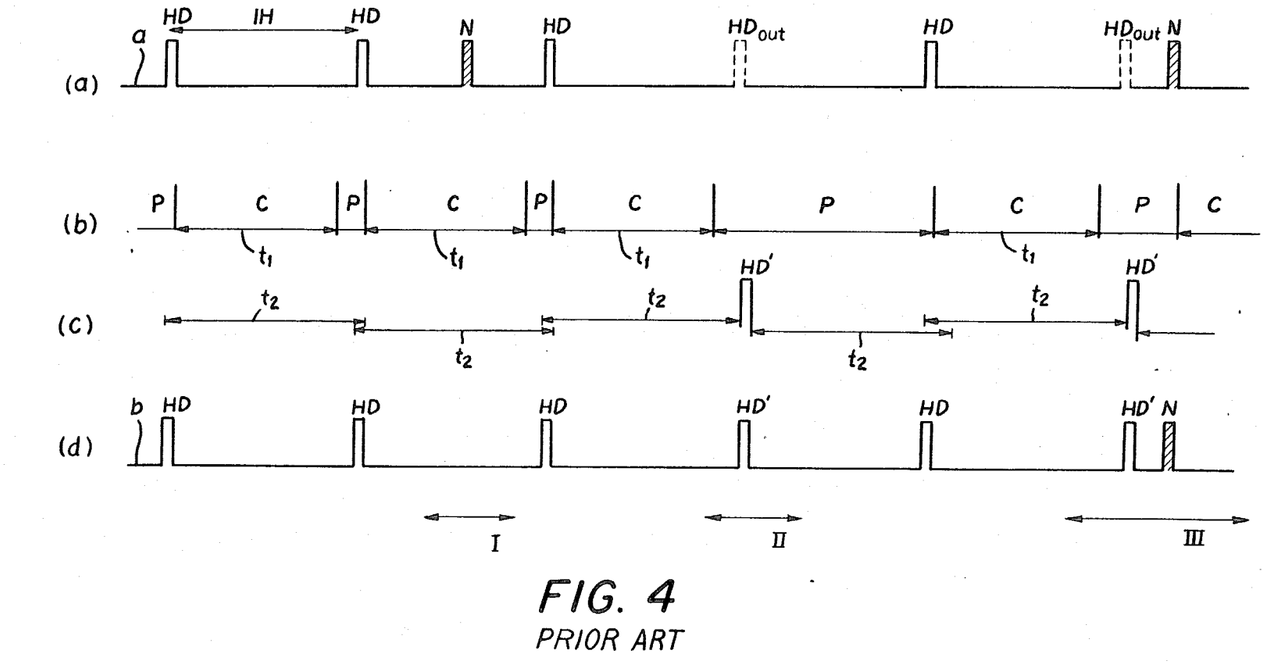
FIG. 4 is a functional explanatory diagram.

The respective functions or performances which take place during the time periods I, II and III shown in FIG. 4 are explained as follows:

(i) Re: Time period I. Since the noise pulse cutting circuit 1 takes a pulse cutting mode C due to the HD pulse which precedes the noise pulse N, the noise pulse N is removed and is never included in the external output signal "b".

(ii) Re: Time period II. A compensation horizontal drive pulse HD' is output from the compensation pulse generating circuit 2 upon the lapsing of time t2 after the generation of the HD pulse which precedes HDout and this compensation pulse HD' is included in the external output signal "b". In this instance, the compensation pulse HD' is not fedback to the noise pulse cutting circuit 1 so that the noise pulse cutting circuit 1 remains in the pulse pass mode P after the generation of the compensation pulse HD' and this pulse pass mode P continues until the HD pulse passes after HDout.

(iii) Re: Time period III. When HDout occurs, the compensation pulse HD' is generated in the same manner as in the above (ii) and this is included in the external output signal "b". However, since there is no feedback of the compensation pulse HD' to the noise pulse cutting circuit 1, the pulse pass mode P continues even after the generation of the pulse HD'. Since the noise pulse N is input while the pulse pass mode P still continues, the noise pulse N is included in the external output signal "b" after passing through the noise pulse cutting circuit 1. That is to say that the noise N cannot be removed. Moreover, in this situation, as is clear from FIG. 4 (b), the pulse cutting circuit 1 changes its mode to the pulse cutting mode C due to the generation of the noise pulse N and, thus, the output is not made for the following HD pulse but is made only after the lapse of a predetermined time. Consequently, the generation of a noise such as that occurring during the time period III makes it impossible to effect the accurate counting of pulses.

In summary, as will be understood from the comparison with the embodiment illustrated in FIG. 3, it is due to the feedback of HD' that, despite the noise pulse N which is generated following HDout, the noise pulse N can be removed and only the HD' which takes the place of HDout can be output. Needless to say that when there occurs HDout or noise pulse N independently, a noise of this nature can of course be removed.

EMBODIMENT 2

Figure 5:
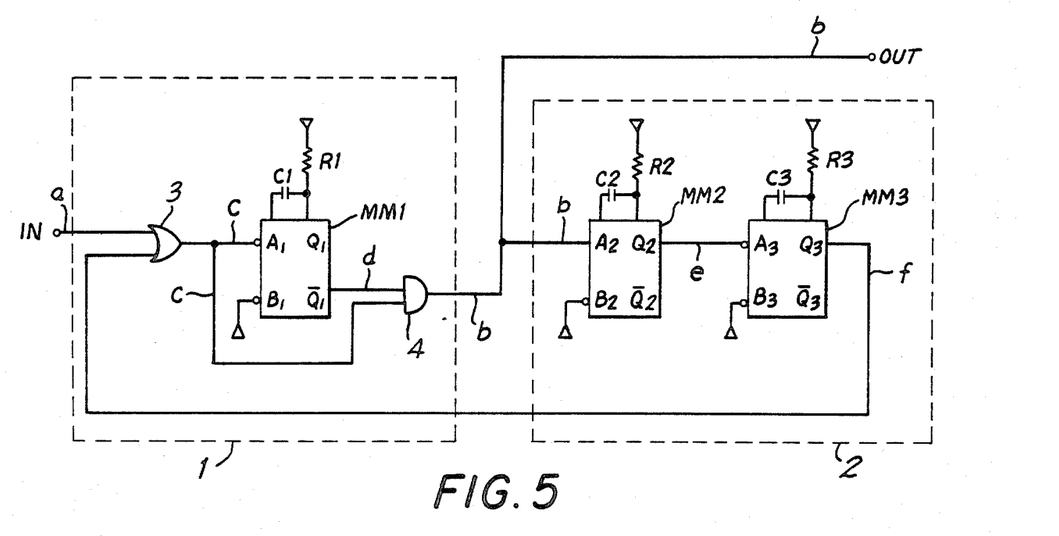
FIG. 5 is a structural diagram of a second embodiment of the present invention.

Now another embodiment of the present invention in which the compensation circuit employs monostable multivibrators is explained by making reference to FIG. 5. As shown in that drawing, a noise pulse cutting circuit 1 according to this embodiment comprises a monostable multivibrator MM1, an OR gate 3 and an AND gate 4. The monostable multivibrator MM1 consists of TTL (Transistor-Transistor-Logic circuit) and is of a non-re-triggerable type adapted to be triggered by a negative edge. Moreover, quasi-stable time t1, a quasi-stable state which continues after the triggering takes place, is slightly shorter than 1 H, that is T1≲1H, and the quasi-stable time t1 is set by an external capacitor C1 and a resistor R1. On the other hand, the compensation pulse generating circuit 2 comprises a monostable multivibrator MM2 and a monostable multivibrator MM3. The monostable multivibrator MM2 consists of a TTL and is of a re-triggerable type adapted to be triggered by a positive edge. The quasi-stable time t2 is slightly longer than 1 H, the relation being T2≳1H. The quasi-stable time t2 is set by an external capacitor C2 and a resistor R2. The monostable multivibrator MM3 consists of a TTL and is of a non-re-triggerable type adapted to be triggered by a negative edge. The quasi-stable time T3 equals the time corresponding to the pulse width of the HD pulse. The quasi-stable time T3 is set by an external capacitor C3 and a resistor R3.

Figure 6:
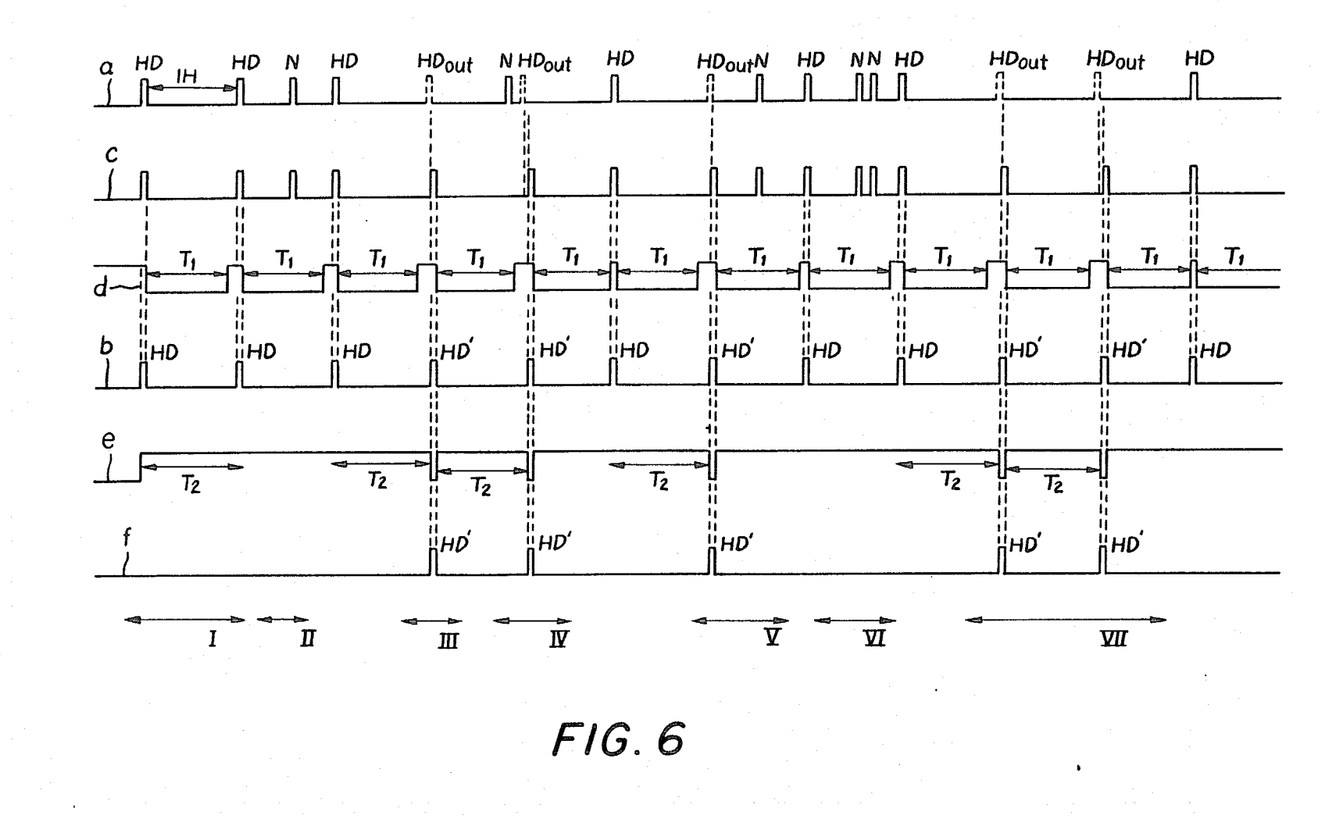
FIG. 6 is a functional explanatory diagram for the second embodiment.

The respective functions or performances concerned of this embodiment are hereinafter explained with reference to FIG. 5 and FIG. 6 which is a functional explanatory diagram.

(1) When no noise is occurring: During the time period I in FIG. 6, for example, an HD pulse of a horizontal drive pulse signal "a" passes the OR gate 3 and a pulse is generated at an OR signal "c". Under this state, since the monostable multivibrator MM1 is in a stable state and its output signal "d" is at a high level (hereinafter abbreviated as H), a pulse HD which corresponds to the regular HD pulse is generated at the external output signal "b" which is an AND output of the OR signal "c" and the output signal "d". When the pulse of the OR signal "c" falls down, the monostable multivibrator MM1 is triggered and its output signal "d" becomes a low level L (hereinafter abbreviated as L) and this state continues for time T1. Upon the lapsing of time T1, the monostable multivibrator MM1 reverts to its stable state and the output signal "d" becomes H. At the point when the output signal "d" returns to H, the next HD pulse is generated and a pulse is generated in the OR signal "c". Therefore, the pulse HD which corresponds to the regular HD pulse is generated at the external output signal "b". Thus, when a noise is not occurring, the pulse HD which corresponds to the regular HD pulse is generated in the external output signal "b" at the interval of 1 H. This monostable multivibrator MM2 is triggered continuously by the pulses of the external output signal "b" and its output signal "e" continues to remain at H. As a result, the output signal "f" of the monostable multivibrator MM3 remains unchanged at L.

(2) When a noise pulse N occurs independently: In the case of the time period II as shown in FIG. 6, for example, the noise pulse N passes through the OR gate 3 and a pulse corresponding to the noise pulse is generated at the OR signal "c". However, the monostable multivibrator MM1 has already been triggered by the HD pulse which precedes the noise pulse N and its output signal "d" is at L. Therefore, the OR signal "c" which includes the noise pulse and the output signal "d" which is at L are subjected to logical AND operation at the AND gate 4 and, consequently, no pulse is generated at the external output signal "b". Thus, the noise pulse N is removed.

(3) When the drop-out HDout of an HD pulse occurs independently: In the case of the time period III as shown in FIG. 6, for example, upon the lapsing of time T2 after the generation of the HD pulse which precedes HDout, the monostable multivibrator MM2 reverts to its stable state and its output signal "e" becomes L. As this occurs, the monostable multivibrator MM3 is triggered and a pulse HD' is generated at the output signal "f". This pulse HD' passes through the OR gate 3 and since, at this point of time, the output signal "d" is at H, the compensation pulse HD' caused by a pulse HD' of the output signal "f" is generated at the external output signal "b". Thus, even when HDout occurs, the compensation pulse HD' which takes the place of the regular HD pulse is generated. When the compensation pulse HD' is generated, the output signal "e" becomes H and at the point when the compensation pulse HD' falls down, the output signal "d" becomes L.

(4) When the drop-out HDout of an HD pulse occurs following the generation of the noise pulse N: In the case of the time period IV in FIG. 6, for example, when the noise pulse N is generated, this noise is removed in the same way as in the above (2) and when the HDout occurs the compensation pulse HD' is generated in the same way as in the above (3).

(5) When the noise pulse N occurs following the drop-out HDout of an HD pulse: In the case of the time period V in FIG. 6, for example, when the HDout occurs the compensation pulse HD' is generated in the same way as in the above (3). Immediately after the generation of the compensation pulse HD', the OR signal "c" changes from H to L and the monostable multivibrator MM1 is triggered, thereby the output signal "d" becomes L. Therefore, the noise pulse N which follows HDout is removed due to the logical AND operation with the output signal "D" which is L.

(6) When the noise pulse N occurs continuously: When the noise pulse N is generated twice as exemplified in the time period VI in FIG. 6, each time the noise pulse is generated the same function as under the above (2) takes place and the noise pulse is removed.

(7) When the drop-out HDout of an HD pulse occurs continuously: When the HDout occurs twice as in the time period VII in FIG. 6, at the first HDout the compensation pulse HD' is generated in the same way as in the above (3). At the second HDout, at the point when the time T2 elapses from the time when HD' is generated for the first HDout, the compensation pulse HD' is generated in the same way as in the above (3).

EMBODIMENT 3

A further embodiment of the present invention in which the compensation circuit employs monostable multivibrators is herein explained with reference to FIG. 7. In the embodiment shown in the drawing, the noise pulse cutting circuit 1 comprises a monostable multivibrator MM1', a NAND gate 5 and an AND gate 6. The monostable multivibrator MM1' consists of a C-MOS and is of a re-triggerable type adapted to be triggered by a positive edge. The quasi-stable time T1', which is a quasi-stable state and continues after the triggering, is slightly shorter than 1 H, that is, $T1' \leq 1H$, and the quasi-stable time T1' is set by an external capacitor C1' and a resistor R1'. On the other hand, the compensation pulse generating circuit 2 comprises a monostable multivibrator MM2' and a monostable multivibrator MM3'. The monostable multivibrator MM2' consists of a C-MOS and is of a re-triggerable type adapted to be triggered by a positive edge. The quasi-stable time T2' is slightly longer than 1 H, that is $T2' \geq 1H$. The quasi-stable time T2' is set by an external capacitor C2' and a resistor R2'. The monostable multivibrator MM3' consists of a C-MOS and is of a re-triggerable type adapted to be triggered by a negative edge. The quasi-stable time T3' equals the time corresponding to the pulse width of the HD pulse. The quasistable time T3' is set by an external capacitor C3' and a resistor R3'. This embodiment of the invention includes an inverter 7.

Figure 7:
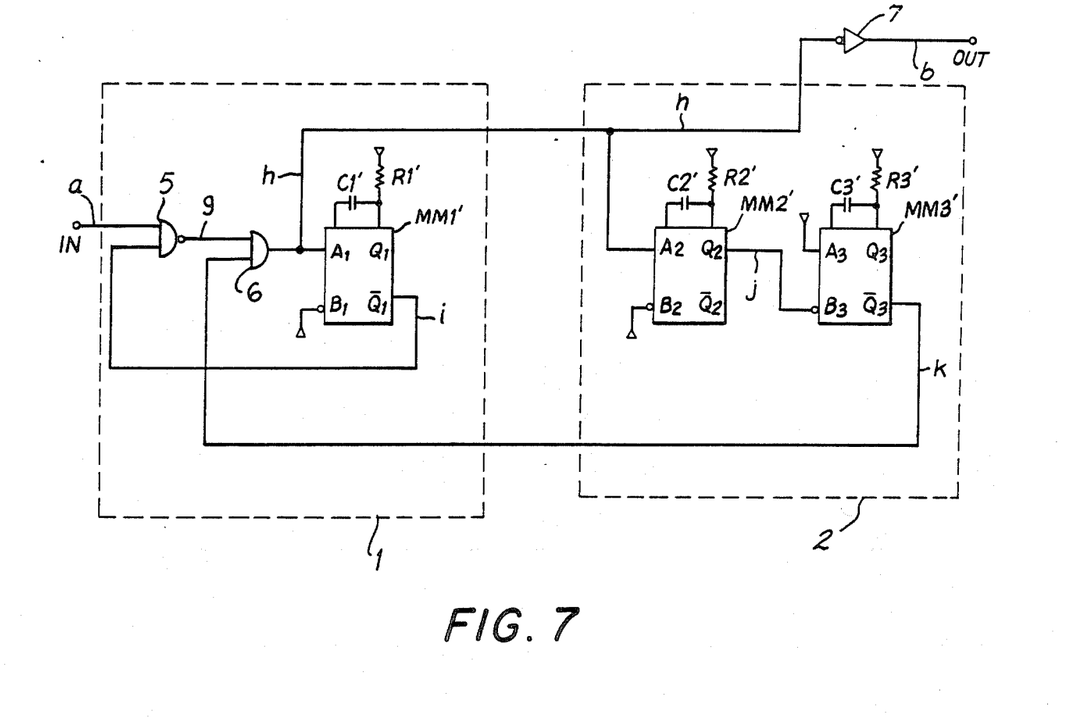
FIG. 7 is a structural diagram for a third embodiment of the present invention.
Figure 8:
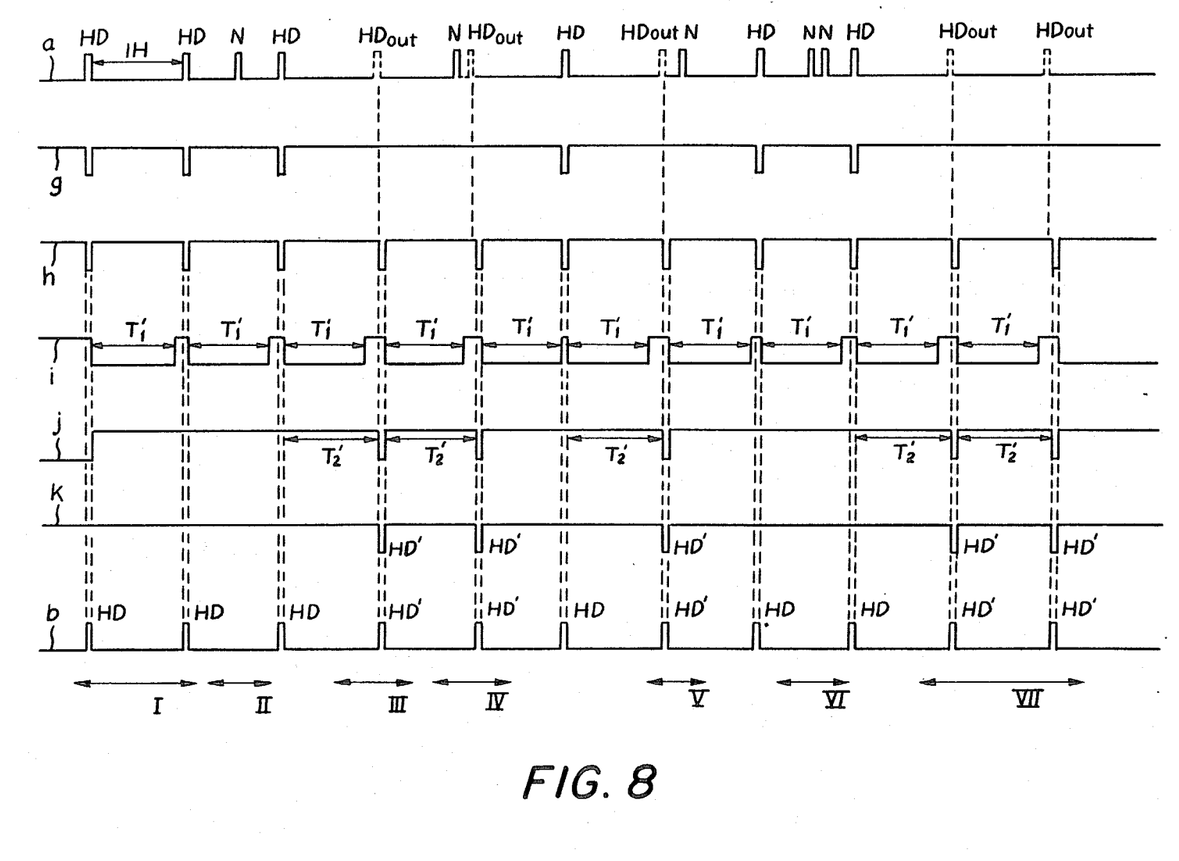
FIG. 8 is a functional explanatory diagram for the third embodiment.

The function of this embodiment with respect to the respective modes is explained by making reference to FIG. 7 and FIG. 8 which is a functional explanatory diagram.

(1) When no noise of any kind occurs: In the case of the time period I as shown in FIG. 8, when the HD pulse of the horizontal drive pulse signal "a" is input to the NAND gate 5, a negative polarity pulse is generated at the NAND signal "g" since the output signal "i" is at H. When this negative polarity pulse of the NAND signal "g" is input to the AND gate 6, the negative polarity pulse is generated at the AND signal "h" because the output signal "k" is at H. Consequently, at the external output signal "b" which is inverted from the AND signal "h" by the inverter 7, the pulse HD which corresponds to the regular HD pulse is generated. When the negative polarity pulse of the AND signal "h" rises, the monostable multivibrator MM1' is triggered and its output signal "i" becomes L. This state continues for time T1'. When the time T1' lapses, the monostable multivibrator MM1' reverts to its stable state, thereby the output signal "i" becomes H. At the point when the output signal "i" reverts to H, the next HD pulse is generated and, since the negative polarity pulse is generated at the NAND signal "g" and the AND signal "h", the pulse HD which corresponds to the regular HD pulse is generated at the external output signal "b". Thus, when there occurs no noise, the pulse HD which corresponds to the regular HD pulse is generated at the external output signal "b" at the interval of 1 H. The monostable multivibrator MM2' is triggered continuously by the negative polarity pulse of the AND signal "h" and, therefore, the output signal "j" thereof remains H. As a result, the output signal "k" of the monostable multivibrator MM3' remains H.

(2) When the noise pulse N occurs independently: In the case of the time period II in FIG. 8, when the noise pulse N is generated, the monostable multivibrator MM1' has already been triggered by the HD pulse which precedes the noise pulse N and the output signal "i" thereof is L. Therefore, the horizontal drive pulse signal "a" which includes the noise pulse N and the output signal "i" which is at L are subjected to the logical NAND operation at the NAND gate 5 and, therefore, a pulse is not generated at the NAND signal "g". Therefore, no pulse which is caused by the noise pulse is generated at the AND signal "h", that is, the external output signal "b". Thus, the noise pulse N is removed.

(3) When the drop-out HDout occurs independently: In the case of the time period III in FIG. 8, when the time T2' elapses after the generation of the HD pulse which precedes HDout, the monostable multivibrator MM2' reverts to its stable state and the output signal "j" thereof becomes L. Then, the monostable multivibrator MM3' is triggered and the pulse HD' is generated at the output signal "k". This pulse HD' is input to the AND gate 6 and since the NAND signal "g" is at H at this point of time, the compensation pulse HD' caused by the pulse HD' of the output signal "k" is generated at the signal "h", that is, the external output signal "b". Thus, even when the HDout occurs, the compensation pulse HD' which takes the place of the regular HD pulse is generated. When the compensation pulse HD' is generated, the output signal "j" becomes H and at the trailing edge of the compensation pulses HD' the output signal "i" becomes L.

(4) When the drop-out HDout of an HD pulse occurs following the generation of the noise pulse N: As exemplified in the time period IV in FIG. 8, when the noise pulse N is generated, this is removed in the same way as in the above (2) and when the HDout occurs the compensation pulse HD' is generated in the same way as in the above (3).

(5) When the noise pulse N occurs following the drop-out HDout of an HD pulse: As exemplified in the time period V in FIG. 8, when the HDout occurs, the compensation pulse HD' is generated in the same way as in the above (3). Immediately following the generation of the compensation pulse HD', the AND signal "h" becomes H from L, thereby the monostable multivibrator MM1' is triggered and the output signal "i" becomes L. Consequently, the noise pulse N which follows the HDout and the output signal "i" which is at L are subjected to the logical NAND operation and, as a result of this, the noise pulse N is removed.

(6) When the noise pulse N occurs continuously: As exemplified in the time period VI in FIG. 8, when two noise pulses N are generated, each time the noise pulse is generated the performances as explained in the above (2) take place and thus the noise pulse N is removed.

(7) When the drop-out HDout of an HD pulse occurs continuously: As exemplified in the time period VII in FIG. 8, when the HDout occurs twice, at the first HDout, the compensation pulse HD' is generated in the same way as in the above (3). Further, at the second HDout, at the point where the time T2 elapses after the time when the HD' is generated for the first HDout, the compensation pulse HD' is generated in the same way as in the above (3).

EMBODIMENT 4

Figure 9:
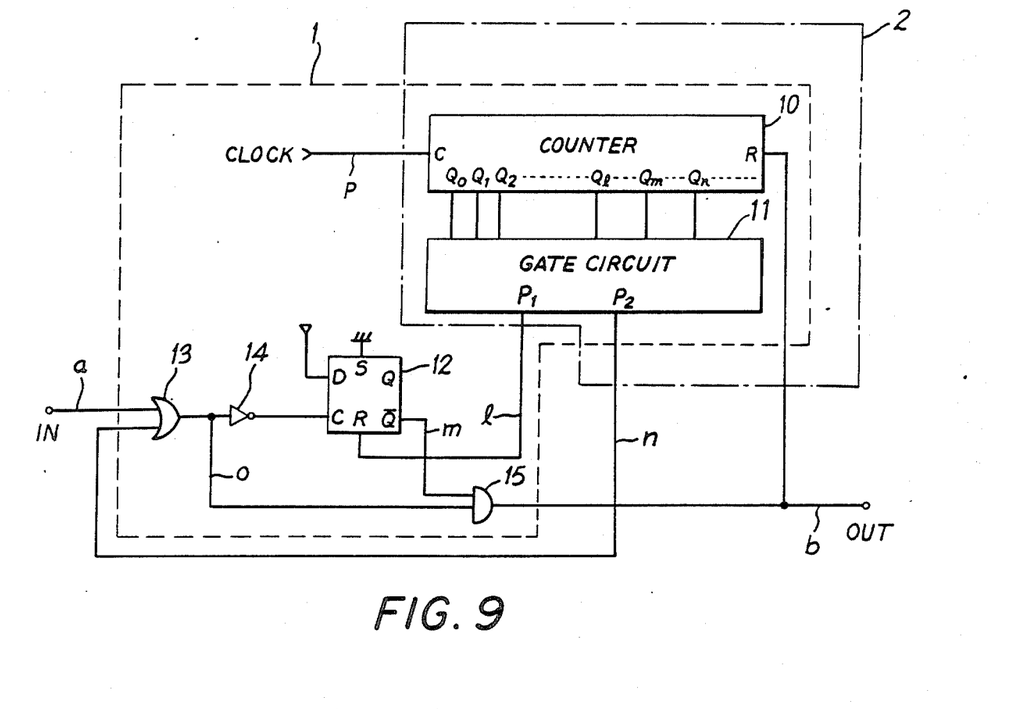
FIG. 9 is a structural diagram showing a fourth embodiment of the present invention.

A still further embodiment of the present invention in which the compensation circuit employs a counter is hereinafter explained based on FIG. 9. As shown in the drawing, the noise pulse cutting circuit 1 in this embodiment comprises a counter 10, a gate circuit 11, a flip-flop circuit 12, an OR gate 13, an inverter 14 and an AND gate 15. The compensation pulse generating circuit 2 includes the counter 10 and the gate circuit 11. That is to say that the counter 10 and the gate circuit 11 are commonly used for the noise pulse cutting circuit 1 and the compensation pulse generating circuit 2. The counter 10 receives a clock signal P and counts its pulses. The counter 10 is reset when the pulse is input to the reset terminal R. The gate circuit 11 receives the output of the counter 10 and, when the counter 10 counts up to the first set count number, the positive pulse is output from the output terminal P1 of the gate circuit 10 and, when the counter 10 counts up to the second set count number which is larger than the first set count number, the positive pulse is output from the output terminal P2 of the gate circuit 10. In this case, the first and the second set count numbers are set in such a way that the time T1" for counting from the count zero to the first set count number is slightly shorter than 1 H and that the time T2" which is for counting from the count zero to the second set count number is slightly longer 1 H.

Figure 10:
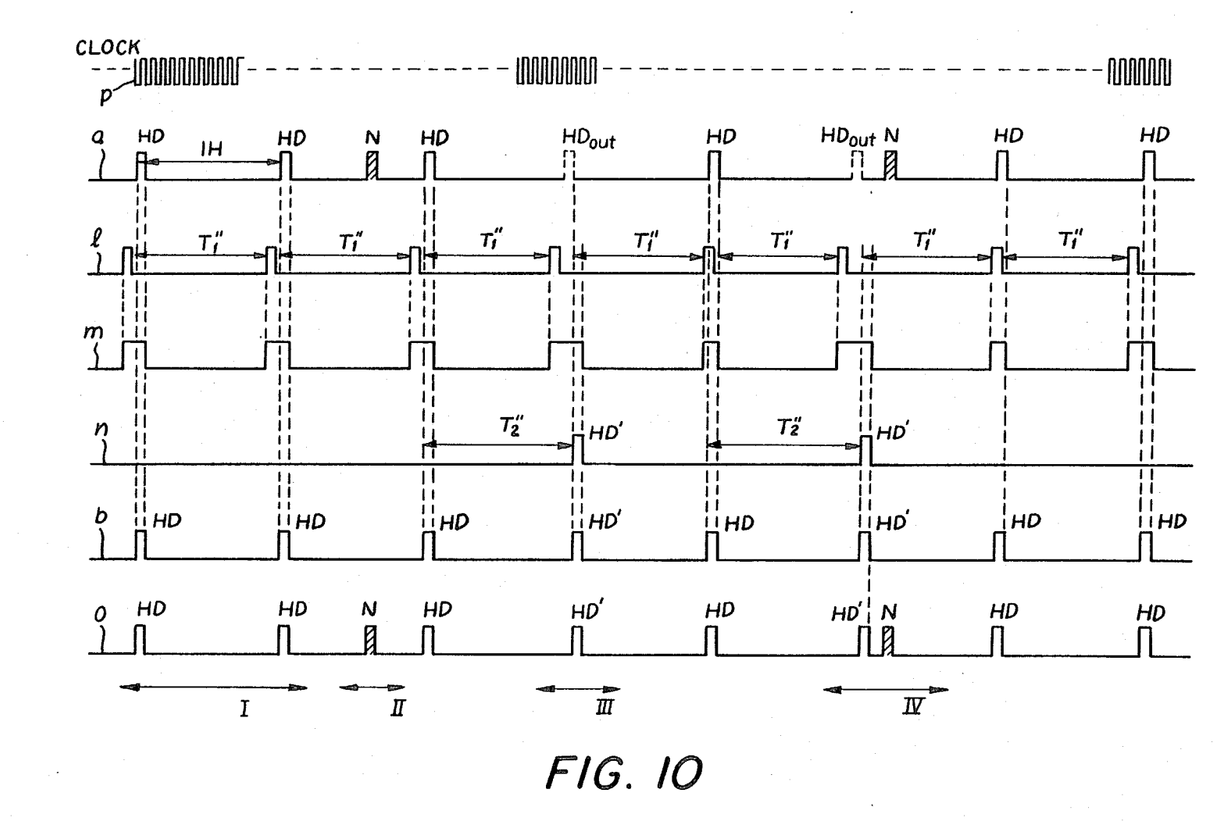
FIG. 10 is a functional explanatory diagram for the fourth embodiment.

The functions or performances of this embodiment with respect to various modes are explained hereinafter based on FIG. 9 and FIG. 10 which is a functional explanatory diagram.

(1) When no noise of any kind occurs: In the case of the time period I exemplified as shown in FIG. 10, the HD pulse of the horizontal drive pulse signal "a" passes through the OR gate 13 and a pulse is generated at the OR signal "o". Then, the flip-flop circuit 12 is in its stable state and, since its output signal "m" is at H, the pulse HD which corresponds to the regular HD pulse is generated at the external output signal "b" which is the AND output of the OR signal "o" and the output signal "m". At the trailing edge of the pulse of the OR signal "o", the flip-flop circuit 12 is triggered and its output signal "m" becomes L. Further, the counter 10 is reset by the pulse HD of the external output signal "b". When the counter 10 commences counting from the count zero and counts up to the first set count number in time T1", a pulse is output from the output terminal P1 of the gate circuit 11. In short, the positive pulse is generated at the output signal "1" and this is input to the reset terminal R of the flip-flop circuit 12. As a result, the flip-flop circuit 12 takes a stable state and its output signal "m" becomes H. When the next HD pulse is generated at the OR signal "o", this pulse and the output signal "m" are subjected to the logical AND operation, and, as a result of this, a pulse HD which corresponds to the regular HD pulse is generated at the external output signal "b". Thus, when no noise is generated, the pulse HD which corresponds to the regular HD pulse is generated at the external output signal "b" at the interval of 1 H. In this case, the pulse HD of the external output signal "b" is input to the reset terminal R of the counter 10 at the interval of 1 H and, thus, the counter 10 never counts up to the second set count value. Such being the case, no pulse is ever output from the output terminal P2 of the gate circuit 11 and, thus, the output signal "n" remains unchanged at L.

(2) When the noise pulse N occurs independently: In the case of the time period II in FIG. 10, the noise pulse N passes through the OR gate 13 and a pulse corresponding to the noise pulse N is generated at the OR signal "o". However, the flip-flop circuit 12 is triggered by the HD pulse which precedes the noise pulse N and its output signal "m" is at L. Consequently, the OR signal "o" which includes the noise pulse and the output signal "m" which is at L are subjected to the logical AND operation at the AND gate 15 and, therefore, no pulse is generated at the external output signal "b". Thus, the noise pulse N is removed.

(3) When the drop-out HDout of an HD pulse occurs independently: In the case as exemplified in the time period III in FIG. 10, when the time T1" elapses after the generation of the HD pulse which precedes HDout, a pulse is output from the output terminal P1 and when the time T2" elapses the pulse HD' is output from the output terminal P2. Then, the flip-flop circuit 12 is reset by the pulse from the output terminal P1 and its output signal "m" becomes H. Also, the pulse HD' of the output signal "n" passes through the OR gate 13 and the pulse HD' comes out also at the OR signal "o". Consequently, the output signal "m" which became H and the OR signal "o" which includes the pulse HD' are subjected to the logical AND operation at the AND gate 15 and the compensation pulse HD' is included in the external output signal "b". It will be understood from this that even when the HDout occurs the compensation pulse HD' which takes the place of the regular HD pulse is generated at the external output signal "b". The counter 10 is reset by the generation of the compensation pulse HD' and, at the trailing edge of the pulse HD', the flip-flop circuit 12 is triggered and its output signal "m" becomes L.

(4) When the noise pulse N occurs following the drop-out HDout of an HD pulse: As exemplified in the time period IV in FIG. 10, when the HDout occurs the compensation pulse HD' is generated in the same way as in the above (3). Immediately after the generation of the compensation pulse HD', the OR signal "o" changes from H to L and the flip-flop circuit 12 is triggered so that its output signal "m" becomes L. Therefore, the noise pulse N which follows the HDout and the output signal "m" which is at L are subjected to the logical AND operation at the AND gate 15 and, as a result of this, the noise pulse N is removed.

The above description of the invention is intended to be illustrative and not limiting. Various changes or modifications in the embodiments described may occur to those skilled in the art and these can be made without departing from the scope of the invention as set forth in the claims.

I claim:

1. A compensation circuit for pulse signals comprising a noise-pulse cutting circuit and a compensation-pulse generating circuit coupled to an output terminal of the cutting circuit, there being a first, a second and a third monostable multivibrator, said first multivibrator being operative in a stable state and in a quasi-stable state; and wherein said cutting circuit comprises:

said first multivibrator, said first multivibrator being responsive to an input pulse signal applied to said cutting circuit periodically at a predermined period for assuming the quasi-stable state in response to each pulse of the input signal, the duration of quasi-stable state being slightly shorter than said period, said first multivibrator reverting to the stable state at the conclusion of a quasi-stable state; and a gate circuit providing an output pulse of said cutting circuit at said output terminal of said cutting circuit, said gate circuit being operatively connected to an output terminal of said first multivibrator to allow passage of a pulse of said input pulse signal via said output terminal of said cutting circuit to said generating circuit during each stable state and to block passage of a pulse of said input pulse signal to said generating circuit during each quasi-stable state, thereby implementing a pulse-cutting mode of said cutting circuit for blocking a noise pulse occurring during a quasi-stable state of said first multivibrator; and wherein said generating circuit comprises:

said second multivibrator, said second multivibrator assuming a quasi-stable state in response to a pulse outputted by said gate circuit for an interval of time slightly longer than said period, said second multivibrator reverting to a stable state at the conclusion of quasi-stable state; and said third multivibrator, said third multivibrator being triggered by said second multivibrator upon a transistion in said second multivibrator from a quasi-stable state to a stable state generate a compensation pulse at an output terminal of said generating circuit; and wherein said compensation circuit further comprises means for outputting: an output pulse of said cutting circuit during the presence of a pulse of said input pulse signal, and said compensation pulse of said generating circuit upon an absence of a pulse of said input pulse signal.

2. A compensation circuit according to claim 1, wherein said outputting means comprises a logic OR unit connected to the output terminals of said cutting circuit and said generating circuit.

3. A compensation according to claim 1, wherein said outputting means comprises a feedback circuit connected between said output terminal of said generating circuit and an input terminal of said cutting circuit for coupling said compensation pulse to an input terminal of said first multivibrator.

4. A compensation circuit according to claim 3 wherein said feedback circuit includes an OR gate coupled to said input terminal of said first multivibrator for applying said input signal and said compensation pulse to said multivibrator.

5. A compensation circuit according to claim 3 wherein said feedback circuit includes a NAND gate coupled between said input terminal and said output terminal of said first multivibrator for applying said input signal and an output signal of said first multivibrator to the input terminal of said first multivibrator, and said gate circuit comprises and AND gate connected between an output terminal of said NAND gate and the input terminal of said first multivibrator, said AND gate having one input terminal coupled to said NAND gate, and a second input terminal coupled to the output terminal of said generating circuit for applying said input signal and said compensation pulse to said first multivibrator.

6. A compensation circuit for pulse signals comprising a noise-pulse cutting circuit and a compensation-pulse generating circuit; and wherein said cutting circuit comprises a flip-flop responsive to an input pulse signal applied to said cutting circuit periodically at a predetermined period for assuming a first logic state and a second logic state in response to successive pulses of the input signal; and wherein said generating circuit comprises a clock, a counter and a gate circuit, said counter counting clock pulses of said clock for measuring intervals of time, said gate circuit being coupled to said counter for receiving an output count of said counter, said gate circuit outputting a first pulse in response to a first predetermined value of count outputted by said counter and a second pulse in response to a second predetermined value of count outputted by said counter, said first predetermined value of count designating a time interval slightly shorter than said period, said second predetermined value of count designating a time interval slightly longer than said period; and wherein said circuit further comprises means for coupling said first pulse signal and said second pulse signal and said input signal to said flip-flop, said first pulse signal being applied to a reset terminal of said flip-flop, said coupling means applying said second pulse signal and said input signal to an input terminal of said flip-flop; and wherein said compensation circuit further comprises output means responsive to said second pulse signal and an output signal of said flip-flop for outputting an output pulse of said cutting circuit during the presence of a pulse of said input pulse signal and outputting a compensation pulse of said generating circuit upon an absence of a pulse of said input pulse signal; and said output pulse of said output means is applied to a reset terminal of said counter to restart a counting of the counter during successive periods of said input pulse signal.

7. A compensation circuit according to claim 6 wherein said coupling means comprises an OR gate for applying said second pulse signal and said input signal to the input terminal of said flip-flop.

8. A compensation circuit according to claim 7 wherein an output terminal of said OR gate is coupled to the input terminal of said flip-flop, and wherein said output means comprises an AND gate having a first input terminal connected to an output terminal of said flip-flop and a second input terminal connected to the output terminal of said OR gate for outputting the output pulse of said cutting circuit at the output terminal of said AND gate.

* * * * *